United States Patent [19]
Park

[11] Patent Number: 5,518,963
[45] Date of Patent: May 21, 1996

[54] METHOD FOR FORMING METAL INTERCONNECTION OF SEMICONDUCTOR DEVICE

[75] Inventor: Sang H. Park, Bubaleub, Ichonkun, Rep. of Korea

[73] Assignee: Hyundai Electronics Industries Co., Ltd., Kyoungkido, Rep. of Korea

[21] Appl. No.: 499,270

[22] Filed: Jul. 7, 1995

[30] Foreign Application Priority Data

Jul. 7, 1994 [KR] Rep. of Korea ............... 1994-16360

[51] Int. Cl.$^6$ ............................................. H01L 21/44
[52] U.S. Cl. ..................... 437/195; 437/192; 437/190; 216/41
[58] Field of Search .................... 437/190, 192, 437/195, 228; 216/41, 42, 49, 72, 38

[56] References Cited

U.S. PATENT DOCUMENTS

| | | | |
|---|---|---|---|
| 4,410,622 | 10/1983 | Dalal et al. | 437/192 |
| 4,954,423 | 9/1990 | McMann et al. | 437/192 |
| 5,380,679 | 1/1995 | Kano | 437/192 |
| 5,436,199 | 7/1995 | Brighton | 437/192 |

*Primary Examiner*—Tuan H. Nguyen
*Attorney, Agent, or Firm*—Merchant, Gould, Smith, Edell, Welter & Smith

[57] ABSTRACT

A method for forming a metal interconnection capable of minimizing plasma etching damage on a metal layer having a relatively higher step when forming a via hole. The method for forming a metal interconnection of a semiconductor device where a first metal layer and a first insulating layer are formed and a via hole is formed in the first insulating layer, thereby connecting the first metal layer to a second metal layer which is located on a layer different from the first metal layer, comprising; a first step of forming a second insulating layer having the same size as that of the via hole in the first insulating layer over the first metal layer; a second step of forming an etching barrier to cover the second insulating layer for formation of the pattern of the first metal layer; a third step of etching the first insulating layer and the first metal layer using the etching barrier as an etching mask; a fourth step of forming a third insulating layer over the resultant structure formed by the first step to the third step to planarize said resultant structure, and etching the third insulating layer to expose the second insulating layer; a fifth step of removing the exposed second insulating layer and the portion of the first insulating layer exposed by the removal of the second insulating layer; and a sixth step of forming the second metal layer.

5 Claims, 3 Drawing Sheets ative film pattern 80 is formed on the second insulating layer 60.

METHOD FOR FORMING METAL INTERCONNECTION OF SEMICONDUCTOR DEVICE

BACKGROUND OF THE INVENTION

The present invention relates to a method for forming a metal interconnection for connecting metal layers which are formed on different layers from each other in fabricating a semiconductor device.

A prior method for forming metal interconnection will be described with reference to FIG. 1 as follows.

Referring to FIG. 1, there is a sectional view of a semiconductor device after a metal interconnection is formed.

First, a field oxide 2 is formed on a substrate 1 and over the whole surface of the substrate a BPSG (Boro Phospho Silicate Glass) film 3 is formed. A first metal layer 4 having a predetermined pattern is formed on the BPSG film 3 and a first insulating layer 5 and a second insulating layer 6 are successively deposited on the BPSG film 3 including the first metal layer 4. The predetermined portions of the first insulating layer 5 and the second insulating layer 6 are selectively etched to form a via hole. A second metal layer 7 is deposited on the second insulating layer 6 to fill said via hole and is subsequently etched, thereby forming a metal interconnection.

However, the prior method has a problem that when the insulating layers are etched, the surface of the first metal layer, which is formed over a field oxide and has a relatively higher step, is damaged by plasma etching so that a natural oxide film is thickly formed.

SUMMARY OF THE INVENTION

It is an object of the present invention to provide a method for forming a metal interconnection capable of minimizing the plasma etching damage to a metal layer having a relatively higher step when forming a via hole.

These and other objects and features of the present invention can be achieved by providing a method for forming a metal interconnection of a semiconductor device where a first metal layer and a first insulating layer are formed and a via hole is formed in the first insulating layer, thereby connecting the first metal layer to a second metal layer which is located on a layer different from the first metal layer. The method comprises: a first step of forming a second insulating layer having the same size as that of the via hole on the first insulating layer over the first metal layer; a second step of forming an etching barrier to cover the second insulating layer for formation of the pattern of the first metal layer; a third step of etching the first insulating layer and the first metal layer using the etching barrier as an etching mask; a fourth step of forming a third insulating layer over the resulting structure formed by the first step to the third step to planarize said resultant structure, and etching the third insulation layer to expose the second insulating layer; a fifth step of removing the exposed second insulating layer and the portion of the first insulating layer exposed by the removal of the second insulating layer; and a sixth step of forming the second metal layer.

DETAILED DESCRIPTION OF THE INVENTION

Hereinafter, the preferred embodiment of the present invention will be described with reference to the accompanying FIGS. 2A through 2E.

Referring to FIGS. 2A through 2E, there are sectional views respectively illustrating processes for forming a metal interconnection in accordance with the preferred embodiment of the present invention.

Figure 1:
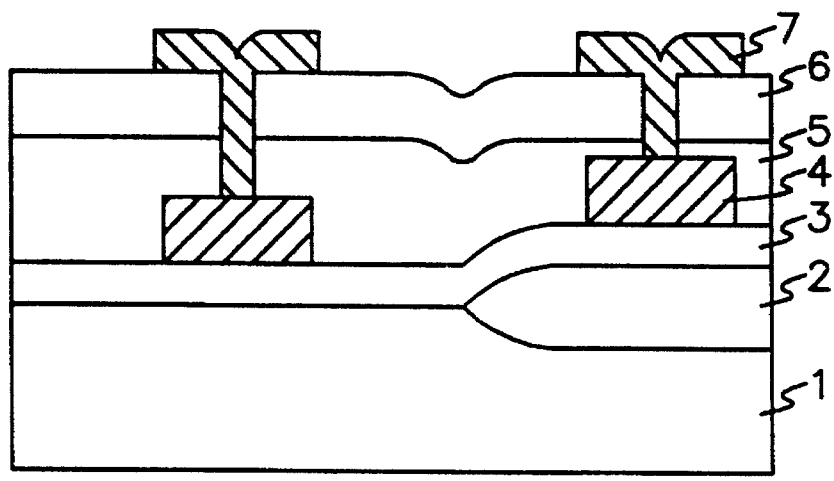
FIG. 1 is a sectional view of a semiconductor device after a metal interconnection is formed.
Figure 2A:
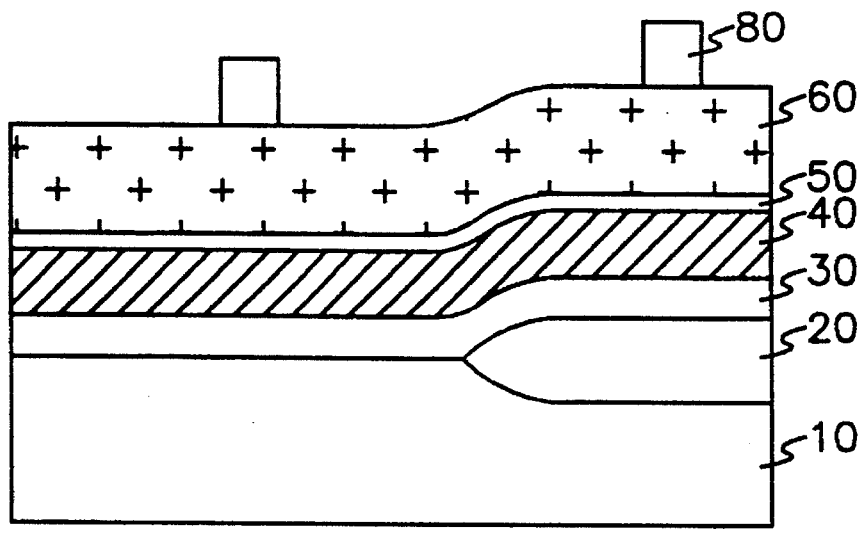
FIGS. 2A through 2E are sectional views respectively illustrating the processes for forming a metal interconnection in accordance with an embodiment of the present invention.

First, as shown in FIG. 2A, a field oxide 20 is formed on a substrate 10 and over the whole surface of the substrate a BPSG(Boro Phospho Silicate Glass) film 30, a first metal layer 40, a first insulating layer 50 and a second insulating layer 60 are successively deposited, and then a first photosensitive film pattern 80 is formed on the second insulating layer 60.

Figure 2B:
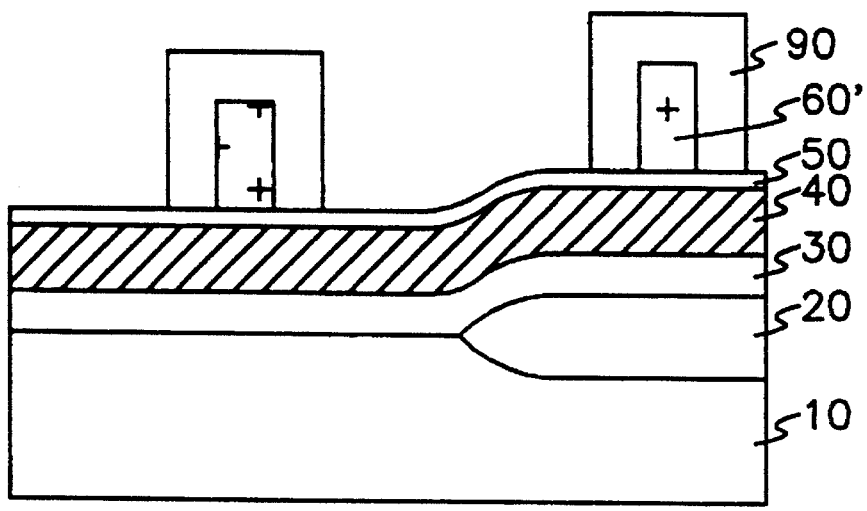

Subsequently, as shown in FIG. 2B, the second insulating layer 60 is anisotropically etched using the first photosensitive film pattern 80 as an etching barrier to form a via bar 60'. Then, the first photosensitive film pattern 80 is removed and a second photosensitive film pattern 90 is formed so as to cover the via bar 60'.

Figure 2C:
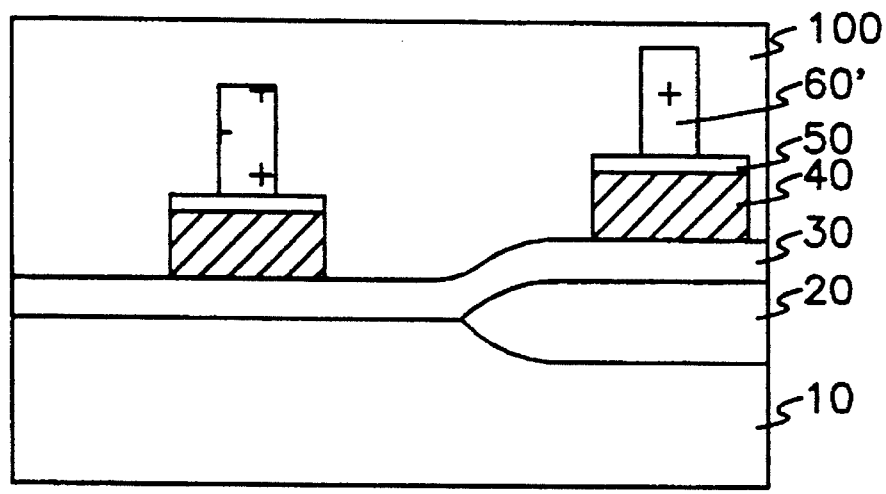

As shown in FIG. 2C, the first insulating layer 50 and the first metal layer 40 are anistropically and successively etched using the second photosensitive film pattern 90 as an etching barrier and then the second photosensitive film pattern 90 is removed. An oxide film 100 for planarization is formed over the resultant structure.

Figure 2D:
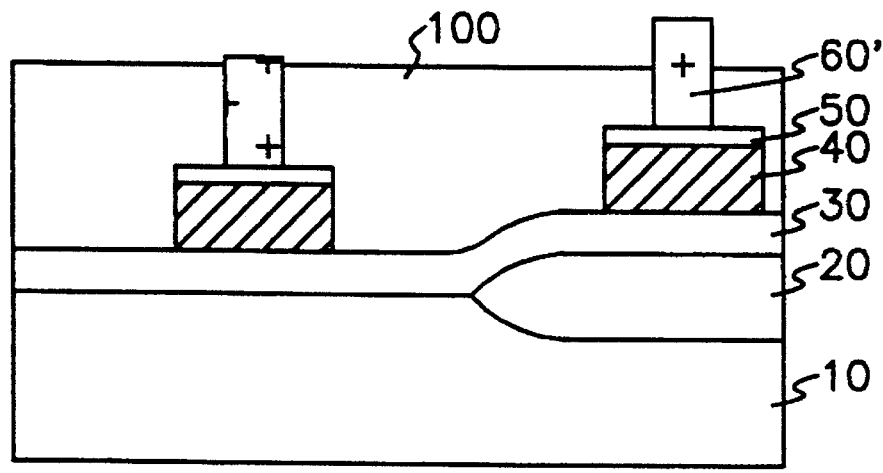

As shown in FIG. 2D, the oxide film 100 for planarization is blanket-etched to expose the via bar 60'.

Figure 2E:
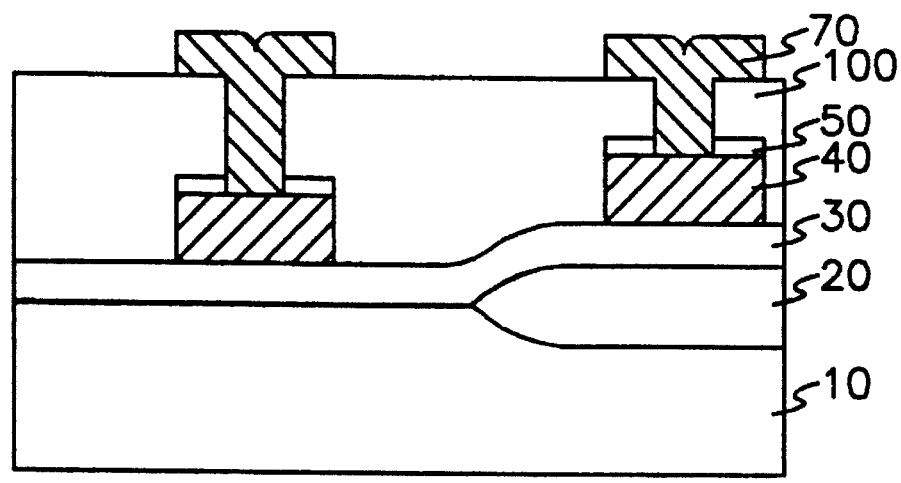

Finally, as shown in FIG. 2E, the via bar 60' is removed by a wet etching method and then the first insulating layer 50 below the via bar 60' is removed, thereby forming a via hole. A second metal layer 70 is deposited over the resultant structure and then etched, thereby accomplishing the metal interconnection.

As mentioned above, the present invention minimizes the plasma etching damage to a metal layer formed over a layer having a relatively higher step when forming a via hole to improve the connection state between interconnections, so that the yield and reliability of the device can be improved.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A method for forming a metal interconnection of a semiconductor device where a first metal layer (40) and a first insulating layer (50) are formed and a via hole is formed in the first insulating layer, thereby connecting the first metal layer to a second metal layer which is located on a layer different from the first metal layer, comprising;

a first step of forming a second insulating layer (60) having the same size as that of the via hole on the first insulating layer over the first metal layer;

a second step of forming an etching barrier (60) to cover the second insulating layer for formation of the pattern of the first metal layer;

a third step of etching the first insulating layer 100 and the first metal layer using the etching barrier as an etching mask and then removing the etching barrier;

a fourth step of forming a third insulating layer over the resulting structure formed by the first step to the third step to planarize said resultant structure, and to etch said third insulating layer to expose the second insulating layer;

a fifth step of removing the exposed second insulating layer and the portion of the first insulating layer exposed by the removal of the second insulating layer; and a sixth step of forming a second metal layer over the resulting structure.

2. The method according to claim 1, wherein said first step includes;

a process of depositing the second insulating layer on the first insulating layer;

a process of forming a photosensitive film having the same size as that of the via hole on the second insulating layer over the first metal layer; and a process of etching the second insulating layer using the photosensitive film as an etching barrier.

3. The method according to claim 1, wherein said etching barrier comprises a photosensitive film.

4. The method according to claim 3, wherein said second insulating layer and the first insulating layer comprise an insulation film having wet-etching selectivity.

5. The method according to claim 4, wherein at the fifth step of removing said second insulating layer, said second insulating layer is removed by a wet etching method using the etching selectivity of the second insulating layer and the first insulating layer.

* * * * *

UNITED STATES PATENT AND TRADEMARK OFFICE
CERTIFICATE OF CORRECTION

PATENT NO. : 5,518,963

DATED : MAY 21, 1996

INVENTOR(S) : SANG H. PARK

It is certified that error appears in the above-identified patent and that said Letters Patent is hereby corrected as shown below:

Column 2 line 62 delete "60" and substitute -- 60' -- .

Column 2 line 65 delete "60" and substitute -- 90 -- .

Column 3 line 1 delete "100" and substitute -- 50 -- .

Signed and Sealed this

Twenty-eighth Day of September, 1999

*Attest:*

Q. TODD DICKINSON

*Attesting Officer*   *Acting Commissioner of Patents and Trademarks*